(12) United States Patent
Fredrickson

(10) Patent No.: US 6,826,723 B2
(45) Date of Patent: Nov. 30, 2004

(54) MULTI-RATE REED-SOLOMON ENCODERS

(75) Inventor: Lisa Fredrickson, Long Beach, CA (US)

(73) Assignee: Agere Systems Inc., Allentown, PA (US)

( * ) Notice: Subject to any disclaimer, the term of this patent is extended or adjusted under 35 U.S.C. 154(b) by 549 days.

(21) Appl. No.: 09/851,380

(22) Filed: May 9, 2001

(65) Prior Publication Data

US 2003/0154440 A1 Aug. 14, 2003

(51) Int. Cl.[7] .............................................. H03M 13/15
(52) U.S. Cl. ........................................................ 714/784
(58) Field of Search ......................................... 714/784

(56) References Cited

U.S. PATENT DOCUMENTS

| | | | |
|---|---|---|---|
| 5,444,719 A | | 8/1995 | Cox et al. |
| 6,219,816 B1 | * | 4/2001 | Tezuka ........................ 714/84 |
| 2003/0154440 A1 | * | 8/2003 | Fredrickson ................ 714/784 |

OTHER PUBLICATIONS

Syed Shahzad Shah, Saqib Yaqub, Faisal Suleman, Chameleon Logics, Self–correcting codes conquer noise part 2: Reed–Solomon codecs, Mar. 15, 2001, EDN. Boston, vol. 46, Iss. 6; p. 107 (8 pages).*

Torjell Berg, Aaron Brennan, Try a faster way to run Reed–Solomon, Nov. 6, 2000, Electronic Engineering Times. Manhassel. p. 98 (2 pages).*

* cited by examiner

Primary Examiner—R. Stephen Dildine

(57) ABSTRACT

The present invention provides for smaller, faster Reed-Solomon encoders, while at the same time providing support of multiple codes in a simple architecture having a reduced number of Galois field multipliers. In accordance with the principles of the present invention, a polynomial is factored differently than conventional Reed-Solomon encoders, resulting in enhanced performance, simplified circuitry, and/ or a reduction of critical paths in the Reed-Solomon encoders. Thus, not only are the number of required Galois field multipliers reduced, but support for three different Reed-Solomon codes is provided with a minimized number of Galois field multipliers. In the disclosed embodiments, rather than implementing n subfilters each representing an individual degree polynomial filter as in Cox's conventional Reed-Solomon encoder, the present invention implements multiple degree polynomials factored in a way which is convenient to a desired plurality of Reed-Solomon codes. The polynomials may be divided into any degree subtrunks convenient for the particular application. One preferred embodiment supports up to three Reed-Solomon codes all within a single architecture, comprising only three cascaded filters. Each of the individual filters balances and reduces critical path lengths in the Reed-Solomon encoder, and reduces the loading of critical nets, resulting in a Reed-Solomon encoder with a greater throughput for a given technology. For instance, the conventional Cox taught Reed-Solomon encoder would require, e.g., 24 subfilters to provide n bytes of redundancy, each subfilter having polynomial having a single degree. However, in accordance with the principles of the present invention, three different Reed-Solomon codes may be provided (e.g., 14 bytes of redundancy, 22 bytes of redundancy, or 24 bytes of redundancy), by cascading three multiple degree polynomial subfilters (e.g., a first subfilter of degree 14, a second subfilter of degree 8, and a third subfilter of degree 2).

20 Claims, 4 Drawing Sheets

BLOCK DIAGRAM OF PREFERRED EMBODIMENT OF MULTI-RATE RS ENCODER

STANDARD REED SOLOMON ENCODER

BLOCK DIAGRAM OF MULTI-RATE RS ENCODER

BLOCK DIAGRAM OF PREFERRED EMBODIMENT OF MULTI-RATE RS ENCODER

TWO CASCADED SUBFILTERS OF [1]

SUBFILTER EQUIVALENT TO JUDICIOUSLY PAIRED SUBFILTERS OF [1]

MULTI-RATE REED-SOLOMON ENCODERS

BACKGROUND OF THE INVENTION

1. Field of the Invention

This invention relates generally to Reed-Solomon encoders. More particularly, it relates to a Multi-Rate Reed-Solomon encoder.

2. Background

Reed-Solomon codes are block-based error correcting codes with a wide range of applications in digital communications and storage. Reed-Solomon codes are used to correct errors in many systems including storage devices (including tape, Compact Disk, DVD, barcodes, etc), wireless or mobile communications (including cellular telephones, microwave links, etc), satellite communications, digital television/DVB, high-speed modems such as ADSL, xDSL, etc.

A Reed-Solomon encoder takes as input a block of digital data, comprising a sequence of digital information bits, and interprets it as a sequence of information symbols. Each such symbol comprises m bits of the digital information sequence. The block of input data comprises k such information symbols. The Reed-Solomon encoder produces p additional redundant symbols, which are concatenated with the k information symbols to form a codeword comprising n=k+p symbols. The parameters of the Reed-Solomon code are indicated by referring to such a code as an RS(n,k) code with m bit symbols.

Errors occur during transmission or storage for a number of reasons (for example noise or interference, scratches on a CD, etc). A Reed-Solomon decoder processes each block and attempts to correct errors and recover the original data. The number and type of errors that can be corrected depends on the characteristics of the Reed-Solomon code. In general, an RS(n,k) decoder can correct any combination of p/2 corrupted symbols provided that the remainder of the n symbols of the codeword are correct.

For instance, a Reed-Solomon encoder may include one popular Reed-Solomon code: RS(255,223) with 8-bit symbols. With this code, each codeword contains 255 code word bytes, of which 223 bytes are data and 32 bytes are parity. In this example, a matching Reed-Solomon decoder can automatically correct up to 16 byte errors anywhere in the codeword.

Reed-Solomon codes are based on a specialist area of mathematics known as abstract algebra, which includes the theory of finite fields, which are also known as Galois fields. A finite field has the property that arithmetic operations (add, multiply, divide, exponentiate, etc.) on field elements always have a result in the field. A Reed-Solomon encoder or decoder needs to carry out these arithmetic operations. Reed-Solomon encoding (and/or decoding) can be carried out in software or in special purpose hardware.

A Reed-Solomon codeword is produced by utilizing polynomial division using the arithmetic of the Galois field. All valid codewords are exactly divisible by the generator polynomial.

The general form of the generator polynomial of a Reed-Solomon code is:

$$g(x)=(x-\alpha^j)(x+\alpha^{j+1}) \ldots (x-\alpha^{j+p-1})$$

where j is an arbitrary integer, $\alpha$ is a special element of the Galois field referred to as a primitive element, and p is the number of redundant symbols to be produced. The input to the encoder is the sequence of information symbols $$\{u_0, u_1, \ldots, u_{k-1}\}$$

which is interpreted as the polynomial $$u(x)=u_0 x^{k-1}+u_1 x^{k-2}+\ldots+u_{k-2}x+u_{k-1}$$

A polynomial division using the Galois field arithmetic processes this polynomial and the generator polynomial to produce a quotient polynomial q(x) and a remainder polynomial r(x) satisfying $$x^p u(x)=q(x)g(x)+r(x),$$

where $$r(x)=r_0 x^{p-1}+r_1 x^{p-2}+\ldots+r_{p-2}x+r_{p-1}$$

The codeword is formed by appending the p redundant symbols to the information symbols, forming the codeword sequence:

$$\{c_0, c_1, \ldots, c_{n-1}\}=\{u_0, u_1, \ldots u_{k-1}, r_0, r_1, \ldots, r_{p-1}\}$$

This sequence has the property that the polynomial:

$$c(x)=c_0 x^{n-1}+c_1 x^{n-2}+\ldots+c_{n-2}x+c_{n-1}$$

is divisible by the generator polynomial g(x).

An example generator polynomial for a Reed-Solomon code RS(255,249) is:

$$g(x)=(x-\alpha^0)(x-\alpha^1)(x-\alpha^2)(x-\alpha^3)(x-\alpha^4)(x-\alpha^5)$$

Using the Galois field arithmetic, the terms of this polynomial are multiplied to form the polynomial:

$$g(x)=x^6=g_5 x^5+g_4 x^4+g_3 x^3+g_2 x^2+g_1 x+g_0$$

where $g_0, g_1, \ldots, g_5$ are specific symbols in the field.

U.S. Pat. No. 5,444,719 to Cox et al., entitled "Adjustable Error-Correction Composite Reed-Solomon Encoder/Syndrome Generator" (hereinafter "Cox"), discloses a conventional combined Reed-Solomon encoder/syndrome generator.

FIG. 1 of the present application shows a block diagram of relevant portions of a conventional Reed-Solomon encoder/syndrome generator disclosed, e.g., in FIG. 2 of Cox.

In particular, as shown herein in FIG. 1, the large circles labeled with generator coefficients $g_i$ 110–116 represent constant multipliers over a Galois field. These generator coefficient multipliers $g_i$ 110–116 tend to dominate the critical net loading, gate count and routing area of a Reed-Solomon encoder. Galois field adders 122–126 each consist of m XOR gates.

The conventional Reed-Solomon encoder shown herein in FIG. 1 is well-known in the art. An advantage of this conventional encoder is that for a judicious choice of $j_0$, the generator coefficients are symmetric, in that $g_0=g_p=1$, $g_1=g_{p-1}$, $g_2=g_{p-2}$, and so on.

In particular, if p is odd, then the generator is symmetric if:

$$j = 2^m - 1 - \frac{p-1}{2}$$

and, if p is even, then the generator is symmetric if:

$$j = 2^{m-1} - \frac{p}{2}$$

If the generator is symmetric, the architecture of FIG. 1 can be implemented with only [p/2] Galois field multipliers, resulting in a simpler implementation than if the generator is not symmetrical. However, a disadvantage of the conventional architecture, e.g., as shown in FIG. 1, is that it does not lend itself easily to supporting more than one specific Reed-Solomon code. This is because the generator coefficients mostly change when a differing number of redundant bytes are to be produced for each of the different Reed-Solomon codes.

The digital filter H(D) 100 of the Reed-Solomon encoder shown in FIG. 1 has a transfer function of the form:

$$H(D) = \frac{Y(D)}{X(D)} = 1 + \frac{1}{\sum_{i=0}^{p} g_i D^{p-i}} = 1 + \prod_{i=0}^{p-1} H_i(D),$$

where $$H_i(D) = \frac{1}{1 + \alpha^{i+j} D}$$

Cox discloses how to produce a Reed-Solomon encoder by cascading p filters with transfer functions of the form $H_i(D)$ as described above, where $i=0, 1, \ldots, p-1$.

One advantage of the implementation disclosed by Cox is that each of the filters $H_i(D)$ can also be used independently to produce the decoder syndrome $S_i$ used in a complementary Reed-Solomon decoder. Cox uses the p filters $H_i(D)$ in cascade to perform the Reed-Solomon encoding function, and in parallel to perform the first step of Reed-Solomon decoding. This reduces the amount of hardware required in an implementation utilizing a Reed-Solomon encoder and decoder in the same integrated circuit chip.

Perhaps the most distinctive feature of Cox's Reed-Solomon encoder is that it implements individual degree polynomial filters. In particular, Cox teaches the use n subfilters, each of degree 1, which are cascaded to produce an encoder transfer function. Cox teaches that these n subfilters can also be used as syndrome calculators. Cox's individual stages of the cascaded filter can be easily disabled, providing for the ability to produce varying amounts of redundancy from the same basic circuit.

However, a disadvantage of Reed-Solomon encoders such as are disclosed by Cox is that the critical path of the Reed-Solomon encoder can be quite long for large values of p. A second disadvantage of the Cox et al. Reed-Solomon encoder is that it fails to reduce the number of Galois field multipliers beyond that which is achieved in the case where the generator polynomial is symmetrical.

There is a need for a Reed-Solomon encoder which is capable of a reduced number of Galois field multipliers, whether or not the generator polynomial is symmetrical, and which is capable of performing any of a plurality of encoding rates.

SUMMARY OF THE INVENTION

In accordance with the principles of the present invention, a multi-rate Reed-Solomon coding device comprises a plurality of multiple degree subfilters. The plurality is less than a maximum number of bytes of redundancy provided by the Reed-Solomon coding device.

A method of providing multiple Reed-Solomon codes in a single coding device in accordance with another aspect of the present invention comprises, for each Reed-Solomon code, grouping a plurality of subfilters into a multiple degree polynomial subfilter. Each grouped plurality of multiple degree polynomial subfilters are optionally cascaded.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides for smaller, faster Reed-Solomon encoders, while at the same time provides support of multiple codes in a simple architecture having a reduced number of Galois field multipliers.

In accordance with the principles of the present invention, a polynomial is factored differently than conventional Reed-Solomon encoders, resulting in a Reed-Solomon encoder having enhanced performance, simplified circuitry, and/or a reduction of critical paths. Thus, not only are the number of required Galois field multipliers reduced, but support for multiple rates, e.g., for three different Reed-Solomon codes is provided with a minimized number of Galois field multipliers.

For instance, in the disclosed embodiments, rather than implementing n subfilters each representing an individual degree polynomial filter as in Cox's conventional Reed-Solomon encoder, the present invention implements multiple degree polynomials factored in a way which is convenient to a desired plurality of Reed-Solomon codes. The polynomials may be divided into any degree subtrunks convenient for the particular application.

Two new embodiments of multi-rate Reed-Solomon encoders (shown in FIGS. 2 and 3, respectively) are disclosed to overcome limitations of conventional Reed-Solomon encoders, particularly with respect to the minimum required number of generator polynomials necessary for proper operation. As stated previously, conventional Reed Solomon encoders implement a filter with the transfer function H(D)=1+F(D), where the "+" indicates Galois field addition, and the filter F(D) is given by:

$$F(D) = \prod_{i=0}^{p-1} H_i(D)$$

Cox et al. teach a factoring of the polynomial to a product of sub-polynomials of degree one, whereas these embodiments are derived using a different factoring of the polynomial F(D), into multiple sub-polynomials whose degrees are greater than one.

One preferred embodiment supports up to three Reed-Solomon codes all within a single architecture, comprising only three cascaded filters. Each of the individual filters balances and reduces critical path lengths in the Reed-Solomon encoder, and reduces the loading of critical nets, resulting in a Reed-Solomon encoder with a greater throughput for a given technology.

For instance, the conventional Cox taught Reed-Solomon encoder would require, e.g., 24 subfilters to provide 24 bytes of redundancy, each subfilter having polynomial having a single degree. However, in accordance with the principles of the present invention, three different Reed-Solomon codes may be provided (e.g., 14 bytes of redundancy, 22 bytes of redundancy, or 24 bytes of redundancy), by cascading three multiple degree polynomial subfilters (e.g., a first subfilter of degree 14, a second subfilter of degree 8, and a third subfilter of degree 2).

Figure 1:
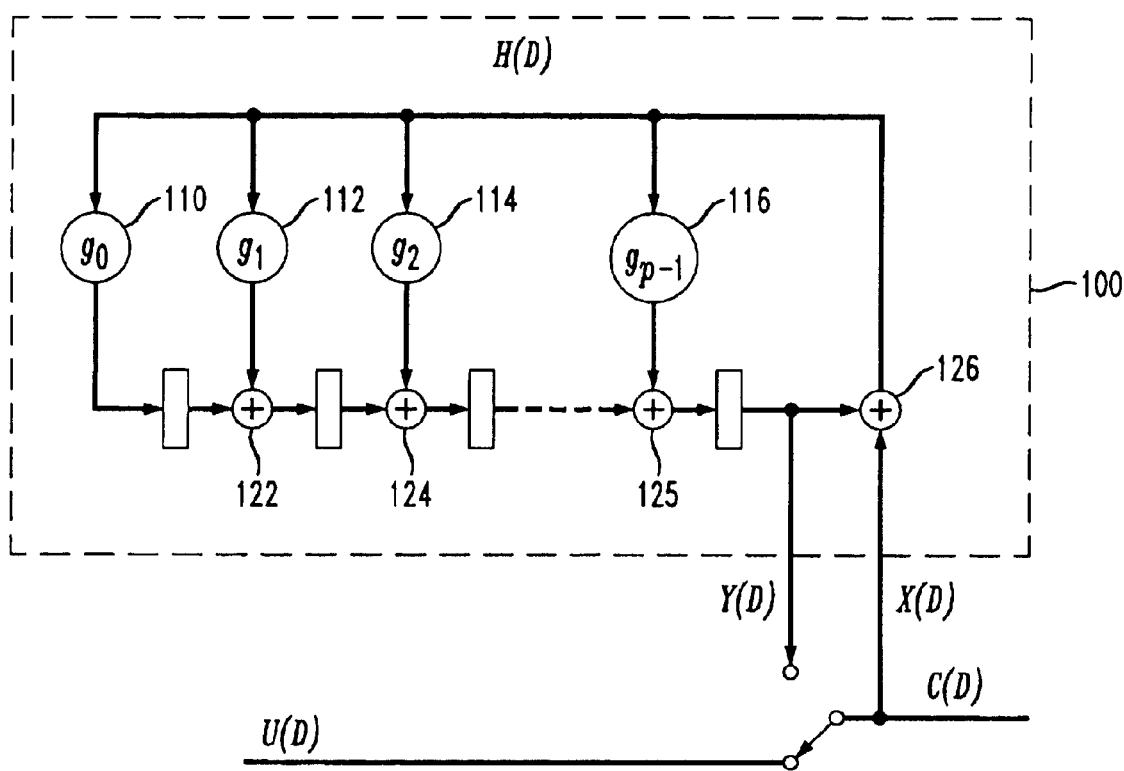
FIG. 1 of the present application shows a block diagram of relevant portions of the Reed-Solomon encoder/syndrome generator disclosed, e.g., in FIG. 2 of Cox.
Figure 2:
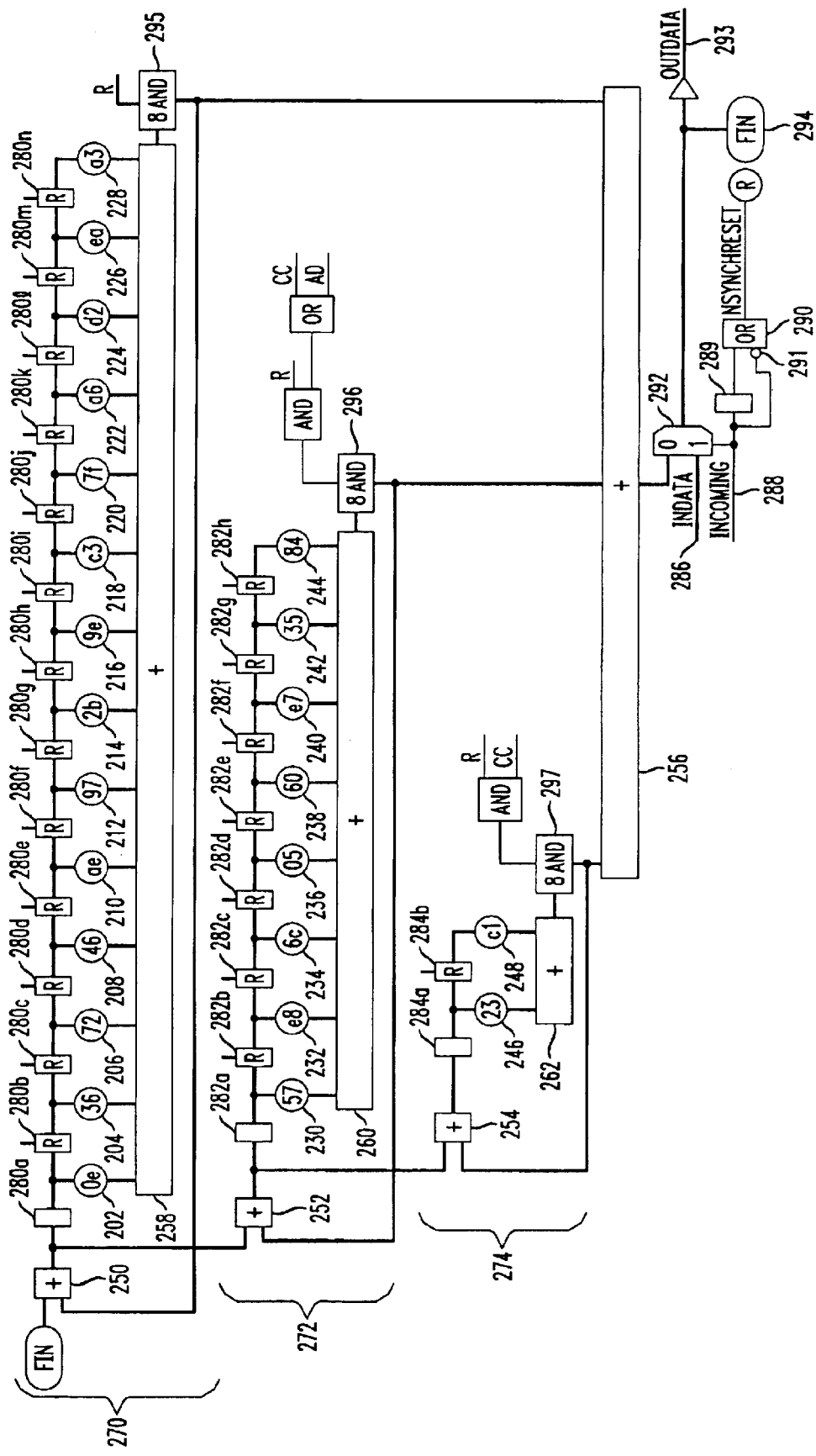
FIG. 2 shows an embodiment of the invention, a multi-rate Reed Solomon encoder which produces three different Reed-Solomon codes, each of which is functionally equivalent to a conventional Reed Solomon encoder such as that shown in FIG. 1.

FIG. 2 shows an embodiment of a Reed-Solomon encoder which factors the filter polynomial F(D) into three polynomials, $$F(D) = \prod_{i=0}^{13} H_i(D)$$

$$F_1(D) = \prod_{i=14}^{21} H_i(D) \text{ and}$$

$$F_2(D) = \prod_{i=22}^{23} H_i(D)$$

FIG. 2 is a block diagram of the encoder. It has 3 rates, one rate (66,52) accomplished by using just the top row filter 270, another rate (255,233) using the top and middle row filters 270, 272, and a third rate (80,56) using all three row filters 270, 272, 274.

As discussed with respect to the conventional Reed-Solomon encoder, the critical path of a Cox et al. Reed-Solomon encoder includes p XOR gates 122–126 in the cascaded filter inputs. The hexadecimal constants 202–248 shown in the circles of FIG. 2 represent constant Galois field multipliers which multiply by the number they are each labeled with, each multiplying by a coefficient in the denominator of the polynomial $F_r(D)$.

In FIG. 2, XORs 250–262 represent bitwise XOR'ing of the respective inputs. Note that the critical path of FIG. 2 contains a constant multiplier (worst-case, 7 XORs), and 8 more XORs around the feedback loop, for a total of 15 XOR delays to produce 24 bytes of redundancy, as compared to a delay of 24 XOR gates as in the cascaded single degree subfilters such as those taught by Cox et al.

Each row 270–274 contains a series of eight bit registers 280a–280n, 282a–282h, 284a, 284b, respectively. All but the first register in each row 270–274 have an active low synchronous reset, marked R. Thus, as shown in the first row 270, there is 1 eight bit register 280a without reset, followed by 13 eight bit registers 280b–280n with reset.

An eight bit bus INDATA 286 represents the incoming data to be encoded. As bytes are input to the encoder, the control signal INCOMING 288 is asserted. An edge detector consisting of a one bit register 289, a NOT gate 291, and an OR gate 290 produces a negative pulse named NSYNCHRESET, which resets all registers having a reset at the beginning of input data to be encoded.

The INCOMING signal 286 is also the select signal to an 8 bit multiplexer (mux) 292, so that when the INCOMING signal is asserted, the bus OUTDATA 293, representing the output of the encoder, is the same as INDATA 286. The output of the mux 292 also provides an input signal FIN 294 to the cascaded filters.

The three filters 270, 272, 274 each form a tapped delay lines, where the outputs of the respective registers are multiplied and summed using Galois field arithmetic. The output of each filter is disabled when the reset signal R is activated, e.g., zero, by putting the output through a bank of eight AND gates 295–297, where the reset signal R is one input to each AND gate 295–297, and one bit of the eight bit filter output is the other input of an AND gate 295–297.

Thus, the output of the first filter 270 is disabled once at the beginning of user data, and is active otherwise. The second filter 272 is disabled once at the beginning of user data, and may be optionally disabled altogether if the control signals CC and AD are both inactive, e.g., zero. The third filter 274 is disabled once at the beginning of user data, and may be optionally disabled altogether if the control signal CC is inactive, e.g., zero.

Each (possibly disabled) filter output goes to two places, back to the input of the filter and to a common Galois field summer at the bottom of FIG. 2.

On the first cycle of user data, the signal FIN is registered at the beginning of each filter. On subsequent cycles, the optionally disabled filter feedback is summed with FIN to create a new signal entering the register bank, and previously entering signals are clocked down the delay line. As the user data proceeds, the output of the bottom summer is ignored.

At the end of user data, the signal INCOMING becomes zero. This causes the output of the mux 292 to become the output of the bottom summer, which becomes OUTDATA and the input to the three filter banks. The circuit remains in this configuration until the desired number of redundant bytes have been produced.

Figure 3:
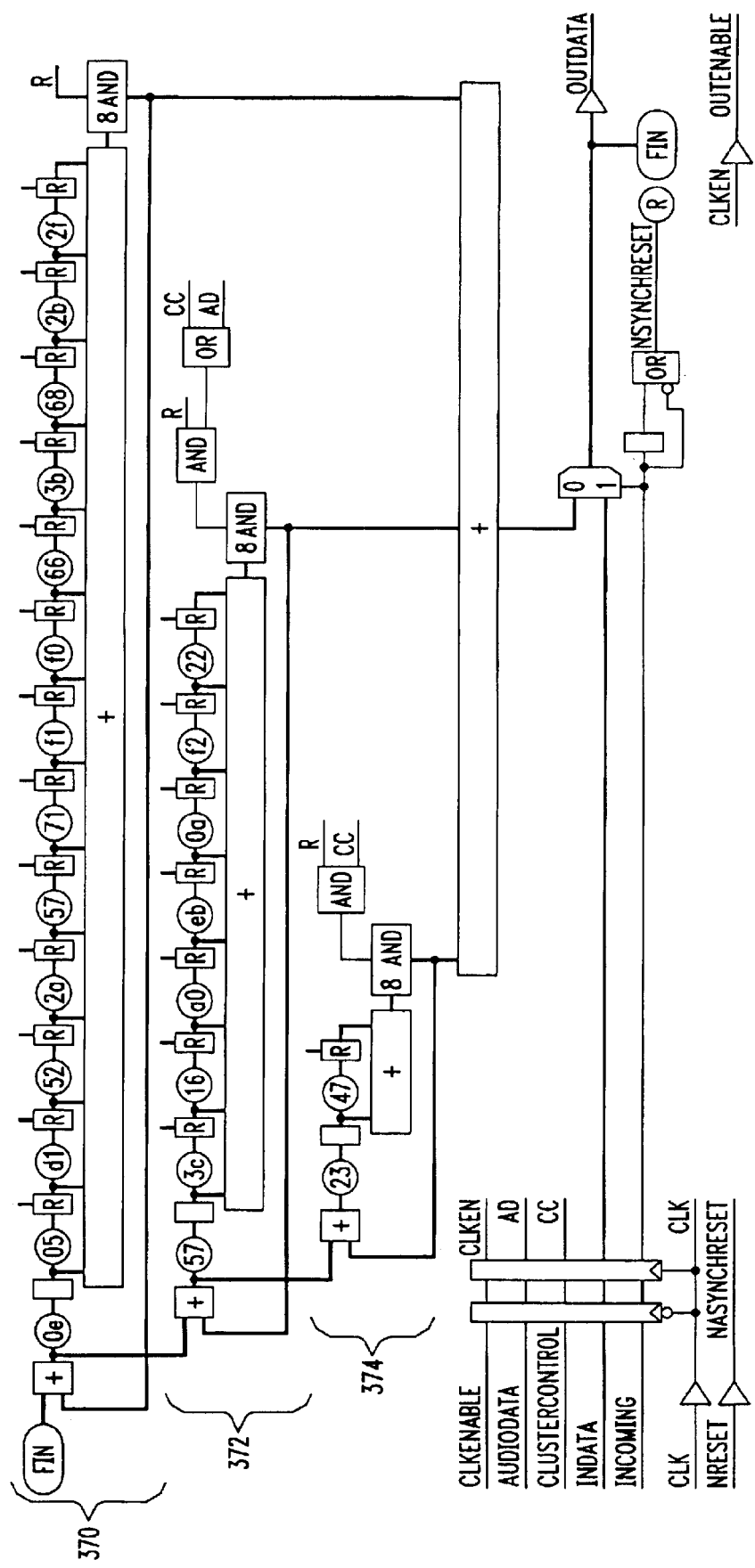
FIG. 3 is a detailed preferred embodiment of the invention, which is functionally equivalent to FIG. 2, but has a reduced critical path including only 7 XOR gates.

FIG. 3 shows a Reed-Solomon encoder which has a reduced critical path using only eleven (11) XOR gates, but otherwise is functionally equivalent to the Reed-Solomon encoder shown in FIG. 2.

In particular, as earlier shown in FIG. 2, each of three sub-filters 370–374 is implemented by summing the weighted outputs of a tapped delay line. Letting the coefficients of a particular tapped delay line in FIG. 2 be numbered $\{m_0, m_1, m_2, \ldots\}$, the output of the sub-filter is given as $$\sum_i m_i D^{i+1}$$

Since all the coefficients are non-zero and elements of a finite field, for each $m_i$ there exists a field element $m_i^{-1}$ such that $m_i m_i^{-1} = 1$.

The coefficients $n_i$ shown in FIG. 3 may be represented as follows.

$n_0 = m_0$, and $n_i = m_{i-1}^{-1} m_i$ when $i > 0$

FIG. 3 is functionally equivalent to the circuit shown in FIG. 2, only the multipliers and registers have been somewhat rearranged. In FIG. 3, there is a multiplier between each eight bit register, and the outputs of the registers are summed. The multiplier constants have been chosen so as to produce the exact same filter outputs as FIG. 2. The advantage of the encoder shown in FIG. 3 is that there is a better distribution of capacitive loads, and a shorter feedback path.

It can be observed that the output of the sub-filter summation tree shown in FIG. 3 is the same as that of FIG. 2. However, instead of a worst-case multiplier, there is a smaller multiplier in the critical path of the Reed-Solomon encoder shown in FIG. 3, which contains a total of eleven (11) XOR gate delays. This smaller propagation delay results in improved throughput as compared to the implementation shown in FIG. 2, and certainly a much smaller propagation delay as compared to encoders such as those taught by Cox et al.

Figure 4:
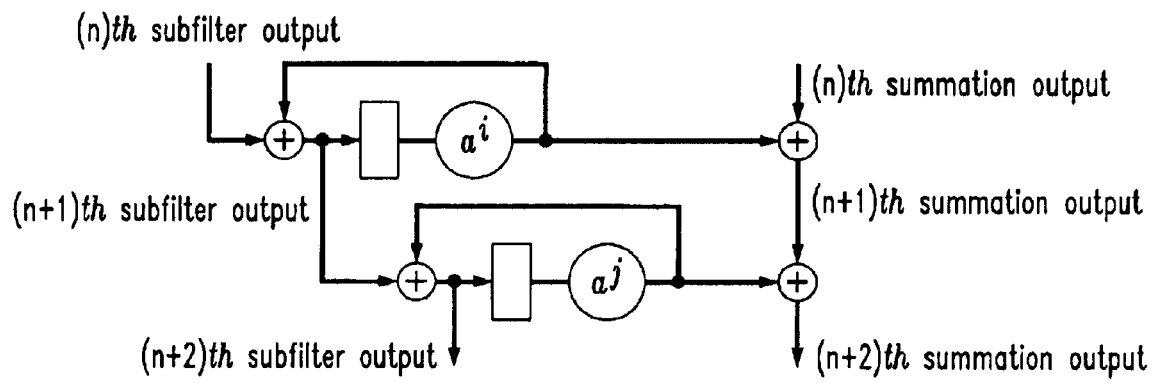
FIG. 4 shows a pair of cascaded filters as in the prior art embodiment of Cox et al.

FIG. 4 shows yet another embodiment of a Reed-Solomon encoder having two successive sub-filter stages shown as a modification of the embodiment such as disclosed by Cox. In particular, FIG. 4 shows two cascaded subfilters such as those disclosed by Cox as part of a larger Reed-Solomon encoder.

As shown in FIG. 4, the two successive sub-filter stages have constant multipliers, one per stage. The first stage has an $\alpha^1$ multiplier and the second has an $\alpha^j$ multiplier.

When the generator polynomial of the Reed-Solomon encoder shown in FIG. 4 is symmetric, each root $\alpha^i$ (for i non-zero) of the generator has a corresponding inverse root $\alpha^{-i}$ of the generator. When p is even, there are exactly p/2 such pairs of roots. When p is odd, there are (p−1)/2 such pairs and the remaining $\alpha^0 = 1$ root.

The sub-filter stage for an $\alpha^0 = 1$ root is $$P_0(D) = \frac{1}{1+D}$$

and requires no constant multipliers.

For the remaining paired roots, define a new filter with transfer function $$P_i = \frac{1}{(1+\alpha^i D)(1+\alpha^{-i} D)} = \frac{1}{1+(\alpha^i + \alpha^{-i})D + D^2}$$

This filter requires only one multiplier for each such pair of roots.

Figure 5:
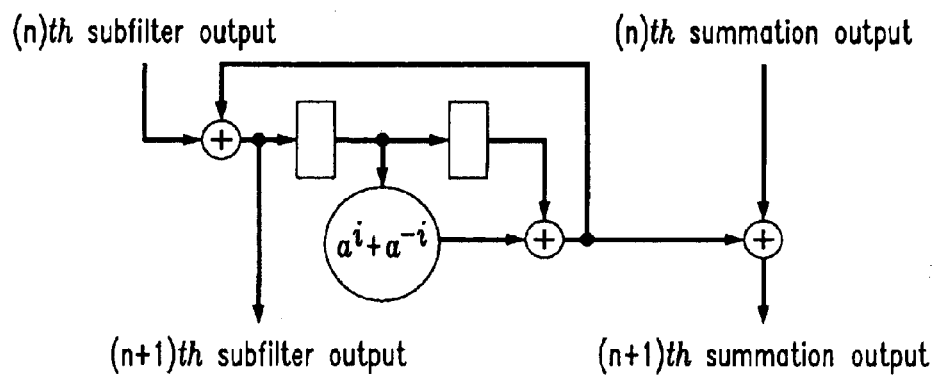
FIG. 5 shows a paired filter which replaces the two cascaded sub-filters shown in FIG. 4 in the case where $\alpha^i = \alpha^{-i}$, in accordance with the principles of the present invention, where single degree polynomials can be judiciously paired to reduce the number of Galois field multipliers.

FIG. 5 shows a paired filter which replaces the two cascaded sub-filters shown in FIG. 4 in the case where $\alpha^j = \alpha^{-i}$, in accordance with the principles of the present invention.

In particular, FIG. 5 represents a simplification of FIG. 4 when the roots of the generator can be grouped as pairs, a Galois field number $\alpha^j$ and its inverse $\alpha^{-i}$. Combining the two filters of FIG. 4 into an equivalent combined filter, it can be observed that there is one less multiplier. These multipliers dominate the complexity of the logic. As in FIG. 3, rectangles represent eight bit registers, all signals represent 8 bit busses, circles marked "+" represent 8 bitwise XOR gates, and circles labeled with powers of α represent constant multipliers. In the special case of symmetric generator polynomials, the required number of constant multipliers may be halved, and delays in the critical path may be reduced.

The Reed-Solomon encoders in accordance with the principles of the present invention provide support, in a single architecture, for multiple choices of redundancy.

While the invention has been described with reference to the exemplary embodiments thereof, those skilled in the art will be able to make various modifications to the described embodiments of the invention without departing from the true spirit and scope of the invention.

What is claimed

1. A multi-rate Reed-Solomon coding device, comprising:
a plurality of multiple degree subfilters grouped into a multiple degree polynomial subfilter, said plurality being less than a maximum number of bytes of redundancy provided by said Reed-Solomon coding device.

2. The multi-rate Reed-Solomon coding device according to claim 1, wherein:
a first rate of said multi-rate Reed-Solomon coding device having a number of bytes of redundancy of a degree of a first one of said plurality of multiple degree subfilters.

3. The multi-rate Reed-Solomon coding device according to claim 2, wherein:
a second rate of said multi-rate Reed-Solomon coding device has a number of bytes of redundancy of a degree of a second one of said plurality of multiple degree subfilters plus said degree of said first one of said plurality of multiple degree subfilters.

4. The multi-rate Reed-Solomon coding device according to claim 3, wherein:
a third rate of said multi-rate Reed-Solomon coding device has a number of bytes of redundancy of a degree of a third one of said plurality of multiple degree subfilters, plus said degree of said second one of said plurality of multiple degree subfilters, plus said degree of said first one of said plurality of multiple degree subfilters.

5. The multi-rate Reed-Solomon coding device according to claim 2, wherein:
said degree of said first one of said plurality of multiple degree subfilters is 14.

6. The multi-rate Reed-Solomon coding device according to claim 3, wherein:
said degree of said second one of said plurality of multiple degree subfilters is 8.

7. The multi-rate Reed-Solomon coding device according to claim 4, wherein:
said degree of said third one of said plurality of multiple degree subfilters is 2.

8. The multi-rate Reed-Solomon coding device according to claim 1, wherein:
said plurality is three.

9. The multi-rate Reed-Solomon coding device according to claim 8, wherein:
said number of bytes of redundancy is 24.

10. A method of providing multiple Reed-Solomon codes in a single coding device, comprising:
for each Reed-Solomon code, grouping a plurality of subfilters into a multiple degree polynomial subfilter; and
optionally cascading each grouped plurality of multiple degree polynomial subfilters.

11. The method of providing multiple Reed-Solomon codes in a single coding device according to claim 10, wherein said grouping comprises:
judiciously pairing said plurality of subfilters into symmetric generators.

12. The method of providing multiple Reed-Solomon codes in a single coding device according to claim 10, wherein:

said cascaded groups of multiple degree polynomial subfilters have a decreasing degree with respect to an order of said cascading.

13. The method of providing multiple Reed-Solomon codes in a single coding device according to claim 10, wherein:

said cascaded groups of multiple degree polynomial subfilters have an increasing degree with respect to an order of said cascading.

14. The method of providing multiple Reed-Solomon codes in a single coding device according to claim 12, wherein:

said cascaded groups of multiple degree polynomial subfilters have degrees of 14, 8 and 2, respectively, in an order of said cascading.

15. Apparatus for providing multiple Reed-Solomon codes in a single coding device, comprising:

means for grouping a plurality of subfilters into a multiple degree polynomial subfilter for each Reed-Solomon code; and means for cascading each grouped plurality of multiple degree polynomial subfilters.

16. The apparatus for providing multiple Reed-Solomon codes in a single coding device according to claim 15, wherein said means for grouping comprises:

means for judiciously pairing said plurality of subfilters into symmetric generators.

17. The apparatus for providing multiple Reed-Solomon codes in a single coding device according to claim 15, wherein:

said cascaded groups of multiple degree polynomial subtilters have a decreasing degree with respect to an order of said cascading.

18. The apparatus for providing multiple Reed-Solomon codes in a single coding device according to claim 15, wherein:

said cascaded groups of multiple degree polynomial subfilters have an increasing degree with respect to an order of said cascading.

19. The apparatus for providing multiple Reed-Solomon codes in a single coding device according to claim 17, wherein:

said cascaded groups of multiple degree polynomial subfilters have degrees of 14, 8 and 2, respectively, in an order of said cascading.

20. The apparatus for providing multiple Reed-Solomon codes in a single coding device according to claim 15, wherein:

said apparatus is an encoder.

* * * * *